United States Patent [19]

Yoda et al.

[11] Patent Number: 4,700,137
[45] Date of Patent: Oct. 13, 1987

[54] HIGH-FREQUENCY MAGNETIC FIELD GENERATOR/DETECTOR

[75] Inventors: Kiyoshi Yoda; Isamu Uetomi; Satoshi Fujimura, all of Hyogo, Japan

[73] Assignee: Mitsubishi Denki Kabushiki Kaisha, Tokyo, Japan

[21] Appl. No.: 756,792

[22] Filed: Jul. 19, 1985

[30] Foreign Application Priority Data

Jul. 20, 1984 [JP] Japan .............................. 59-151908

[51] Int. Cl.$^4$ ............................................. G01R 33/20
[52] U.S. Cl. ..................................... 324/322; 324/318
[58] Field of Search ............... 324/300, 307, 318, 319, 324/320, 322

[56] References Cited

U.S. PATENT DOCUMENTS 3,434,043  3/1969  Nelson ................................ 324/322
4,052,661  10/1977 Higham ............................... 324/322
4,075,552  2/1978  Traficaute ........................... 324/322

FOREIGN PATENT DOCUMENTS 1329776  9/1973  United Kingdom ................ 324/318
2133558  7/1984  United Kingdom .

Primary Examiner—Michael J. Tokar
Attorney, Agent, or Firm—Bernard, Rothwell & Brown

[57] ABSTRACT

A high-frequency magnetic field generator/detector equipped with a saddle type coil assembly which comprises a combination of two similar windings having power supply terminals at one axial end thereof and load terminals at radially symmetrical positions of the other end thereof, wherein a first impedance-matching capacitor is connected between the power supply terminals, while a second impedance-matching capacitor is connected between the load terminals, and a coaxial cable having an electrical length equivalent to a half wavelength is connected between the power supply terminals, thereby matching the input and output impedances with each other.

13 Claims, 3 Drawing Figures

HIGH-FREQUENCY MAGNETIC FIELD GENERATOR/DETECTOR

BACKGROUND OF THE INVENTION

1. Field of the Invention

The present invention relates to a high-frequency magnetic field generator/detector and, more particularly, to a type adapted for use in a nuclear magnetic resonance apparatus.

2. Description of the Prior Art

Out of the conventional devices of such type, there is known an example of FIG. 1.

FIG. 1 is an equivalent circuit diagram of a conventional high-frequency magnetic field generator/detector described in David G. Gadian, "Nuclear Magnetic Resonance and its Application to Living Systems", Oxford University Press, p. 170. In the diagram are shown an inductance 1 of a high-frequency coil, a resistance 2 thereof, impedance-matching variable capacitors 3a and 3b, and an input-output terminal 4 connected to a high-frequency transmitter/receiver (not shown).

In the above configuration, its operation is performed in the following manner.

The impedance of a high-frequency coil is generally different from the input-output impedance of a high-frequency transmitter/receiver (not shown) which is connected to such known device for detecting the generation of a high-frequency magnetic field, so that proper impedance matching is necessary therebetween by means of variable capacitors 3a and 3b to maximize the power transmission efficiency.

In the circuit diagram of FIG. 1 where L and r are an inductance and a resistance of the high-frequency coil, respectively: static capacitances C and C' of the variable capacitors 3a and 3b are expressed as $$C \approx \frac{1 - \sqrt{\frac{r}{R}}}{\omega^2 L}$$

$$C \approx \frac{\sqrt{\frac{r}{R}}}{\omega^2 L}$$

where R is the input-output impedance of the high-frequency transmitter/receiver and $\omega$ is an angular frequency for achieving the above impedance matching.

In an exemplary case of effecting the impedance matching at an angular frequency of 40 MHz as $\omega = 2\pi \times 40 \times 10^6$ sec$^{-1}$, the values of C and C' are obtained as follows when $L = 1 \times 10^{-6}$ (H), r = 1 ($\Omega$) and R = 50 ($\Omega$):

$C \approx 14$ (pF)

$C' \approx 2$ (pF)

Voltages Vc and Vc' applied to the capacitors 3a and 3b respectively are expressed as $$Vc = Vc' = \omega L \sqrt{\frac{P}{r}}$$

where P is a high-frequency input power. The values of Vc and Vc' are obtained as follows when $\omega = 2\pi \times 40 \times 10^6$ sec$^{-1}$, $L = 1 \times 10^{-6}$ (H), P = 1000 (W) and r = 1 ($\Omega$):

$Vc \approx Vc' \approx 8000$ (V)

Since the conventional high-frequency magnetic field generator/detector is so constituted as mentioned above, the capacitances of the variable capacitors employed for impedance matching become extremely small and particularly the value of C' is on the order of 1 pF, so that designing the matching circuit is rendered difficult and satisfactory stability is not attainable.

SUMMARY OF THE INVENTION

It is a primary object of the present invention to achieve easy and stable input-output impedance matching between a high-frequency magnetic field generator/detector and a high-frequency transmitter/receiver for use in detecting generation of a high-frequency magnetic field. And a second object of the invention resides in enhancing the power transmission efficiency. Accordingly, the present invention provides an improved generator detector comprising a high-frequency coil assembly divided at one or more points with a stray capacitance formed thereat, impedance-matching capacitors connected to a load side and a power supply side respectively between the divided high-frequency coils, and a balun converter for coupling a balanced load, which consists of the high-frequency coil assembly and the capacitors, to an unbalanced high-frequency transmitter/receiver, thereby ensuring a high power transmission efficiency and enhancing the stability while facilitating design of the matching circuit.

DESCRIPTION OF THE PREFERRED EMBODIMENT

Figure 1:
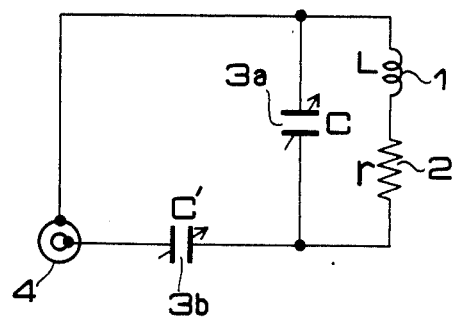
FIG. 1 is a circuit diagram of a conventional high-frequency magnetic field generator/detector.
Figure 2:
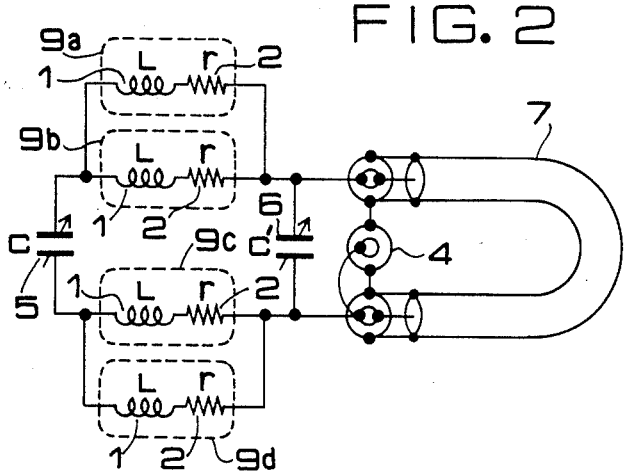
FIG. 2 is a circuit diagram of an exemplary high-frequency magnetic field generator/detector embodying the present invention.
Figure 3:
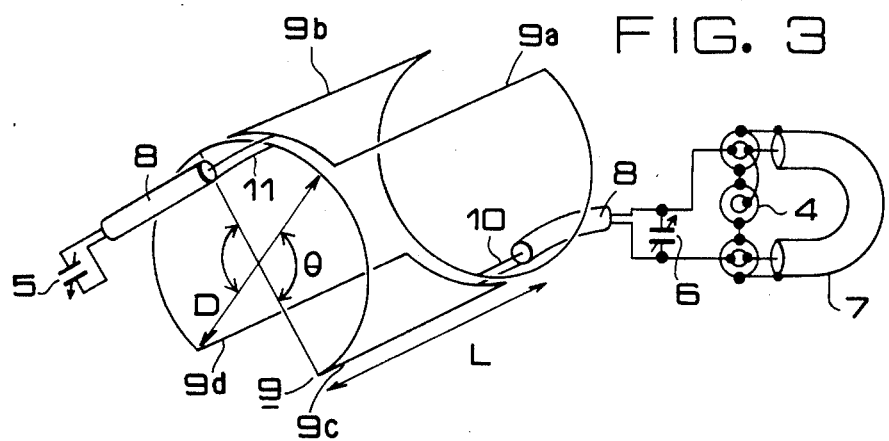
FIG. 3 is a schematic perspective view of the generator/detector shown in FIG. 2.

Hereinafter an exemplary embodiment of the present invention will be described with reference to the accompanying drawings. FIGS. 2 and 3 are respectively a circuit diagram and a perspective view of a high-frequency magnetic field generator/detector embodying the invention.

In the figures, there are shown an inductance 1 of a high-frequency coil assembly 9 divided into individual coils 9a, 9b, 9c and 9d at one or more points with a stray capacitance formed thereat; a resistance 2 of the high-frequency coil assembly 9; and an impedance-matching variable capacitor 5 disposed on the load side between the divided high-frequency coils and connected to an electrode 11 at the point of division of the coil assembly 9. In this embodiment, the high-frequency coil assembly 9 is of a saddle type as illustrated in FIG. 3 and has one point of division which is coincident with the midpoint of its impedance. Also shown are another impedance-matching variable capacitor 6 disposed on the power supply side between the divided high-frequency coils and connected to an electrode 10 on the power supply side of the coil assembly 9; and a balun converter 7 for coupling a balanced load, which includes the high-frequency coil assembly 9 and the capacitors 5 and 6, to an unbalanced high-frequency transmitter/receiver. The balun converter 7 is composed of a coaxial cable having an electrical length equivalent to a half wavelength to enhance the power transmission efficiency.

The high-frequency coil assembly 9 is shaped into a saddle type as illustrated in FIG. 3 and has a length L and a diameter D in a relationship of $0.6D \leq L \leq 2.4D$. In the coil assembly of FIG. 3, an opening angle $\theta$ is set within a range of $100° \leq \theta \leq 140°$. Further shown is a coaxial cable 8 for connecting the saddle-shaped coil assembly 9 to the variable capacitors 5 and 6.

Now the operation of this detector will be described with reference to FIG. 2. Since the impedance of the high-frequency coil assembly 9 is generally different from the input-output impedance of a high-frequency transmitter/receiver (not shown) connected to the coil assembly 9, it is necessary to match the impedance values thereof with each other. Such impedance matching maximizes the intensity of the high-frequency magnetic field generated from the above coil assembly and simultaneously maximizes the sensitivity as well in detecting the high-frequency magnetic field with the coil assembly, thereby achieving a maximal efficiency in transmission of high-frequency energy.

For this purpose, the impedance of the high-frequency coil assembly is set to, e.g. 200 ohms equivalently by the impedance-matching variable capacitors 5 and 6 of FIG. 2.

In the next stage, the high-frequency coil assembly having a balanced impedance is coupled by means of the balun converter 7 to the high-frequency transceiver having an unbalanced input-output impedance.

This converter is also essential for maximizing the high-frequency energy transmission efficiency.

Since the balun converter 7 further has a function of 1:4 impedance conversion, the impedance as viewed from the input-output terminal 4 to the high-frequency coil assembly becomes 50 ohms. Normally the input-output impedance of the high-frequency transmitter/receiver is greater than 50 ohms, so that desired impedance matching is achieved as a result of the above arrangement. It is a matter of course that the method mentioned is effective even when the input-output impedance of the high-frequency transmitter/receiver is of any value other than 50 ohms, and the same matching is attainable merely by changing the constant of the variable capacitors.

In FIG. 2 where L is a combined impedance of the high-frequency coil assembly 9, and r is a combined resistance thereof: static capacitances C and C' of the variable capacitors 5 and 6 are expressed as $$C = \frac{1}{\omega(\omega L - \sqrt{4Rr})}$$

$$C' = \frac{1}{\omega\sqrt{4Rr}}$$

where R is the input-output impedance of the high-frequency transmitter/receiver and $\omega$ is a frequency for achieving the impedance matching.

In an exemplary case of effecting the impedance matching at a frequency of 40 MHz as $\omega = 2\pi \times 40 \times 10^6$ sec$^{-1}$, the values of C and C' are obtained as follows when $L = 1 \times 10^{-6}$ (H), r=1 ($\Omega$) and R=50 ($\Omega$):

$C \approx 17$ (pF)

$C' \approx 280$ (pF)

Voltages Vc and Vc' applied to the capacitors 5 and 6 respectively are expressed as $$Vc = \frac{1}{\omega C}\sqrt{\frac{P}{r}}$$

$$Vc' = \sqrt{4RP}$$

where P is a high-frequency input power. The values of Vc and Vc' are obtained as follows when $\omega = 2\pi \times 40 \times 10^6$ sec$^{-1}$, C=17 (pF), P=1000 (W), r=1 ($\Omega$) and R=50 ($\Omega$):

$Vc \approx 7400$ (V)

$Vc' \approx 450$ (V)

Although in the foregoing embodiment the coaxial cable 8 is used for connecting the variable capacitor to the electrode of the high-frequency coil assembly, the capacitor may be connected directly to the electrode as well. Also the coaxial cable having an electrical length equivalent to a half wavelength and used as a balun converter may be replaced with a branch conductor having an electrical length equivalent to a quarter wavelength or with a Sperrtopf transmission line having an electrical length equivalent to a quarter wavelength.

Furthermore, the length L, diameter D and opening angle $\theta$ of the saddle type coil assembly shown in FIG. 3 are not limited to the aforesaid ranges alone, and some other values may be selected as well.

In addition, the one point of division of the high-frequency coil assembly 9 in the above exemplary embodiment may be changed to two or more points, and at least either of variable and fixed capacitors may be connected to such points. Due to the modification mentioned, there arises the possibility of further facilitating design of the matching circuit.

As described hereinabove, according to the present invention where the static capacitance of each impedance-matching variable capacitor is increasable to be greater than the known value, design of the matching circuit is rendered easier to eventually enhance the circuit stability. Since the withstand voltage of one of the variable capacitors is permitted to be lower than the known level, it becomes possible to attain a dimensional reduction with respect to the matching circuit. Besides the above, employment of the aforesaid balun converter is effective to enhance the power transmission efficiency.

What is claimed is:

1. A high-frequency magnetic field generator/detector comprising: a high-frequency coil assembly divided into a plurality of individual coils at one or more points with a stray capacitance formed at these points of division; impedance-matching capacitors connected to a load side and a power side respectively between the divided high-frequency coils; and a balun converter coupling a balanced load, which comprises said high-frequency coil assembly and said capacitors, to an unbalanced high-frequency transmitter/receiver.

2. The generator/detector as defined in claim 1, wherein said high-frequency coil assembly is of a saddle type.

3. The generator/detector as defined in claim 1 or 2, wherein said balun converter comprises a transmission line having an electrical length equivalent to a half wavelength.

4. The generator/detector as defined in claim 3, wherein said transmission line is composed of a coaxial cable.

5. The generator/detector as defined in claim 1 or 2, wherein said balun converter comprises a transmission line having an electrical length equivalent to a quarter wavelength.

6. The generator/detector as defined in claim 5, wherein said transmission line is composed of a branch conductor.

7. A high-frequency magnetic field generator/detector comprising: a high-frequency coil assembly divided into a plurality of individual coils at one or more points with a stray capacitance formed at these points of division; impedance-matching capacitors connected to a load side and a power side respectively between the divided high-frequency coils; and a balun converter coupling a balanced load, which comprises said high-frequency coil assembly and said capacitors, to an unbalanced high-frequency transmitter/receiver; said balun converter comprising a transmission line having an electrical length equivalent to a quarter wavelength; said transmission line being of Sperrtopf type.

8. The generator/detector as defined in claim 1, wherein said high-frequency coil assembly is divided at one point in such a manner that said point becomes coincident with the midpoint of the impedance of said coil assembly, and said impedance and said impedance-matching capacitances are so arranged as to form a balanced configuration.

9. A high frequency magnetic field generator/detector comprising: a high frequency coil assembly divided into a plurality of individual coils at one or more points with a stray capacitance formed at these points of division; impedance-matching capacitors connected to a load side and a power side respectively between the divided high-frequency coils; and a balun converter coupling a balanced load, which comprises said high-frequency coil assembly and said capacitors, to an unbalanced high-frequency transmitter/receiver; said high-frequency coil assembly being of a saddle type; the length L and the diameter D of said saddle type coil assembly being in a relationship of $0.6D \leq L \leq 2.4D$, and the opening angle $\theta$ of said coil assembly being set within a range of $100° \leq \theta \leq 140°$.

10. A high-frequency magnetic field generator/detector comprising: a saddle type coil assembly which comprises a combination of two similar windings having power supply terminals at one axial end thereof and load terminals at diametrically symmetrical positions of the other axial end thereof; a first impedance-matching capacitor connected between said power supply terminals; a second impedance-matching capacitor connected between said load terminals; and a transmission line having an electrical length equivalent to a half wavelength and connected between said power supply terminals.

11. The generator/detector as defined in claim 10, wherein said transmission line is composed of a coaxial cable.

12. The generator/detector as defined in claim 11, wherein said first and second impedance-matching capacitors are connected between the power supply terminals and the load terminals respectively through coaxial cables.

13. A high frequency magnetic field generator/detector comprising: a saddle type coil assembly which comprises a combination of two similar windings having power supply terminals at one axial end thereof and load terminals at diametrically symmetrical positions of the other axial end thereof; a first impedance-matching capacitor connected between said power supply terminals; a second impedance-matching capacitor connected between said load terminals; and a transmission line having an electrical length equivalent to a half wavelength and connected between said power supply terminals; the axial length L and the diameter D of said saddle type coil assembly being in a relationship of $0.6 \leq L \leq 2.4D$, and the opening angle $\theta$ of said coil assembly being set within a range of $100° \leq \theta \leq 140°$.

* * * * *